United States Patent [19]

Jongepier et al.

[11] Patent Number: 4,636,663
[45] Date of Patent: Jan. 13, 1987

[54] DOUBLE-BALANCED MIXER CIRCUIT

[75] Inventors: Abraham Jongepier; Wolfdietrich G. Kasperkovitz, both of Eindhoven, Netherlands

[73] Assignee: U.S. Philips Corporation, New York, N.Y.

[21] Appl. No.: 627,594

[22] Filed: Jul. 3, 1984

[30] Foreign Application Priority Data

Jul. 8, 1983 [NL] Netherlands ............... 8302438

[51] Int. Cl.[4] .................. G06G 7/00; H03B 19/00
[52] U.S. Cl. .................... 307/529; 328/156; 328/158; 332/16 T; 307/498
[58] Field of Search ............... 307/529, 498; 328/133, 328/160, 15, 156, 158; 332/16 T; 330/254, 69

[56] References Cited

U.S. PATENT DOCUMENTS

| | | | |
|---|---|---|---|
| 3,267,392 | 8/1966 | Hudspeth | 307/557 |
| 3,432,650 | 3/1969 | Thompson | 307/498 |
| 3,684,974 | 8/1972 | Solomon et al. | 330/254 |
| 3,721,766 | 3/1973 | Hilbert | 328/15 |
| 3,783,398 | 1/1974 | Dann | 328/133 |
| 4,187,537 | 2/1980 | Aricola et al. | 330/69 |
| 4,546,275 | 10/1985 | Pena-Finol et al. | 328/160 |

*Primary Examiner*—Larry N. Anagnos
*Assistant Examiner*—Timothy P. Callahan
*Attorney, Agent, or Firm*—Thomas A. Briody; William J. Streeter; Leroy Eason

[57] ABSTRACT

A double-balanced RF mixer circuit comprising two differential amplifiers each of which comprises a pair of transistors the emitters of which are connected in common and the bases of which are cross-coupled to provide common first and second base terminals to which an oscillator signal is applied. A radio frequency signal to be mixed is applied to a voltage-current converter comprising a pair of transistors connected as a balanced common-base circuit, the collectors of such transistors being coupled to the common-emitter terminals of the differential amplifiers. Such a mixer circuit provides improved intermodulation and noise behaviour as compared with mixers in which the voltage-current converter is a conventional differential amplifier.

3 Claims, 1 Drawing Figure

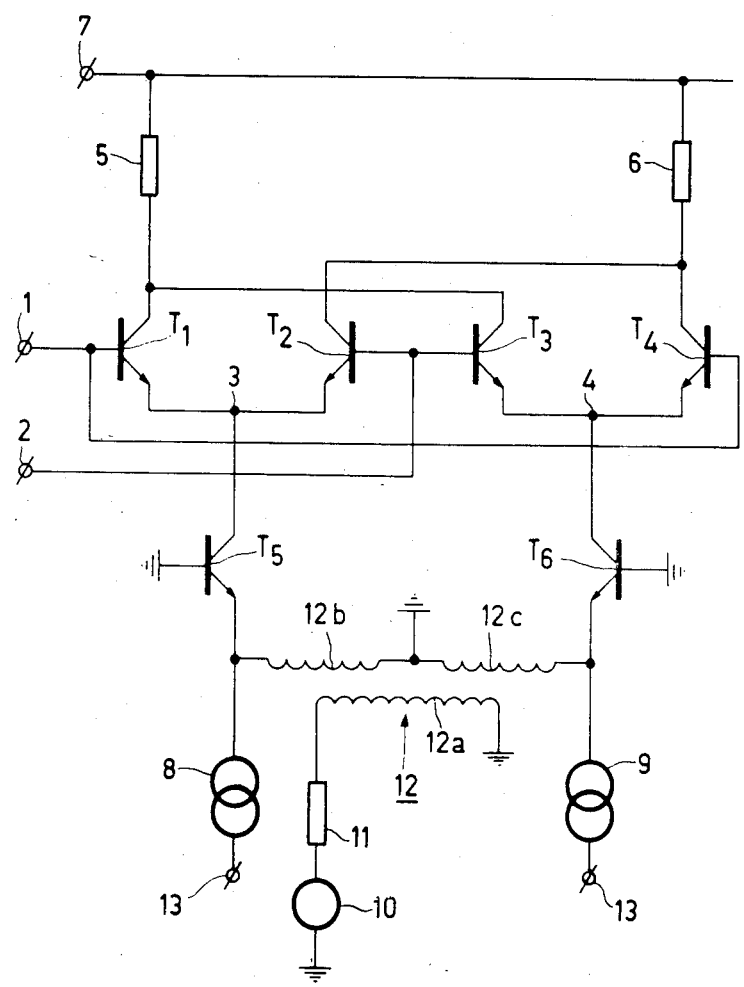

DOUBLE-BALANCED MIXER CIRCUIT

BACKGROUND OF THE INVENTION

1. Field of the Invention

The invention relates to a double-balanced mixer circuit comprising a first differential pair of first and second transistors whose emitters are connected to a common first emitter terminal, a second differential pair of third and fourth transistors whose emitters are connected to a common second emitter terminal, the bases of the first and the fourth transistor and the bases of the second and the third transistor being coupled to a common first and a common second base terminal respectively, between which base terminals a mixing signal may be applied, and a voltage-current converter having an input for receiving an input signal and having first and second outputs which are coupled to the first and the second emitter terminal respectively.

Such a mixer circuit may be used in, for example, radio and television receivers and in automatic mobile telephony receivers.

2. Description of the Related Art

Such a mixer circuit is in particular suitable for use in a one-chip integrated FM receiver as described in the Netherlands Patent Application No. 82.00.959, which receiver is commercially available as the integrated circuit TDA 7000. In this receiver the radio-frequency signal from the aerial is applied to the input of a voltage-current converter, which amplifies this aerial signal and applies the result in phase opposition to the common first and the common second emitter terminal of the first and the second differential pair. By means of an oscillator signal applied to the first and the second common base terminal the radio-frequency aerial signal is mixed down to form an I.F. signal.

An important parameter defining quality of a receiver is the dynamic range of the receiver. The dynamic range is the difference, expressed in dBs, between the minimum signal power required for intelligible reception and the maximum signal power for which reception which is not disturbed by intermodulation products is possible. As in the known receiver the aerial is connected virtually directly to the input of the mixer circuit, the dynamic range of the receiver depends almost entirely on the dynamic range of the mixer circuit. This is because noise and intermodulation products generated in the mixer circuit cannot subsequently be distinguished from the aerial signal. It has been found that in such circuits the quality of the mixer circuit up to very high frequencies is determined by the quality of the voltage-current converter.

In the known receiver the voltage-current converter comprises a differential amplifier which includes a pair of transistors which receive the radio-frequency signal as a single-ended drive, such collectors of the transistors being coupled to the first and the second common emitter terminals of the first and the second differential amplifiers of the mixer circuit. It has been found that the noise and, in particular, intermodulation behaviour of such a differential amplifier is insufficiently good to meet the stringent requirements imposed on the circuit when used in, for example, car radios. The intermodulation is caused by the non-linearity of the differential amplifier of the voltage-current converter. The linearity of the differential amplifier can be improved by arranging resistors in the emitter lines of the differential amplifier transistors, but this results in a deterioration of the noise behaviour.

In German Offlenlegungsschrift No. 31.40.417 it is proposed to dispense with the voltage-current converter differential amplifier. Instead of this amplifier a resistor is arranged in the common emitter lines of each of the differential pairs of the mixer circuit. The radio-frequency signal is applied across these resistors via coupling capacitors. However, this arrangement has the drawback that as a result of the direct signal path between the input of the oscillator signal and the aerial connection, interference originating from the oscillator is radiated to the aerial connection. Such interference is caused by the oscillator signal and harmonics of this signal.

SUMMARY OF THE INVENTION

It is the object of the invention to provide a mixer circuit which shows an improved intermodulation and noise behaviour. To this end a double-balanced mixer circuit of the type specified in the opening paragraph is characterized in that the voltage-current converter comprises a balanced common-base circuit comprising a fifth and a sixth transistor, whose bases are earthed for signal current, whose collectors are coupled to the first and the second emitter terminals respectively and whose emitters are coupled to a common power-supply terminal via respective current-supply elements, which emitters constitute the input of the voltage-current converter.

The invention is based on the recognition of the fact that a balanced common-base circuit has a better linearity and consequently exhibits a better intermodulation behaviour than a differential amplifier and that, in addition, it has a better signal-to-noise ratio than a differential amplifier.

The input signal must be applied to the emitters of the fifth and the sixth transistor in phase opposition. If the signal voltage source is floating, it may be connected directly between the emitters. If one of the terminals of the signal-voltage source is at a fixed voltage, for example in that it is connected to earth, the input signal may be applied to one terminal of the primary of a transformer, the other primary terminal being coupled to a terminal which is at a fixed voltage, which transformer comprises first and second secondary windings which have a common terminal and whose other terminals are coupled to the emitters of the fifth and the sixth transistor respectively. The common terminal of the two secondary windings may be coupled to said terminal which is at a fixed voltage, but alternatively it may be floating because no signal current flows through the common terminal.

BRIEF DESCRIPTION OF THE DRAWINGS

The invention will now be described in more detail, by way of example, with reference to the accompanying drawing, which shows a double-balanced mixer circuit in accordance with the invention.

DESCRIPTION OF THE PREFERRED EMBODIMENTS

The double-balanced mixer circuit shown in the drawing comprises a first differential pair of transistors $T_1$ and $T_2$ having a common first emitter terminal 3 and a second differential pair of transistors $T_3$ and $T_4$ having a common second emitter terminal 4. The bases of the transistors $T_1$ and $T_4$ are coupled to a common first base terminal 1 and the bases of the transistors T₂ and T₃ are coupled to a common second base terminal 2. The collector of the transistor T₃ is coupled to the collector of transistor T₁, which is connected to the positive power-supply line 7 via an impedance 5. Similarly, the collector of transistor T₂ is coupled to the collector of transistor T₄, which is connected to the positive power-supply line 7 by an impedance 6. An oscillator signal is applied between the base terminals 1 and 2, which signal switches the transistors of the first and the second differential pair. The radio-frequency signal from the aerial is superimposed on the emitter currents of the first and the second differential pair, which currents are applied to the emitter terminals 3 and 4. The mixer circuit multiplies the oscillator signal and the radio-frequency signal together so that signals corresponding to the sum of and the difference between the frequencies of the oscillator signal and the radio frequency signal will appear on the collectors of the differential pairs. The signal containing the difference between the frequencies, which is an intermediate-frequency signal, can be obtained by means of a band-pass or a low-pass filter.

As the radio-frequency signal is available in the form of an aerial voltage and must be superimposed as a current on the emitter currents of the differential pairs, a voltage-current converter is required. This voltage-current converter comprises the transistors T₅ and T₆, whose collectors are coupled to the emitter terminals 3 and 4 respectively. For signal currents the transistors T₅ and T₆ operate in common-base mode. The bases of the transistors T₅ and T₆ are at a fixed voltage and in the present case they are connected to earth. Current sources 8 and 9, which each supply a current I, are arranged in the emitter lines of the transistors T₅ and T₆. Moreover, the current sources 8 and 9 are coupled to the negative power-supply terminal 13. It is to be noted that alternatively the current sources 8 and 9 may be formed by means of resistors. The radio-frequency input signal is applied to the emitters of the transistors T₅ and T₆ in phase opposition. The radio-frequency input signal generally originates from a voltage source 10 having a source impedance 11, one terminal of the source being connected to earth. For driving the emitters of the transistors T₅ and T₆, however, a floating source is required. This is achieved by means of a symmetrical transformer 12, which converts the radio-frequency input signal into two signals of opposite phase. The transformer 12 has a primary winding 12a, the input signal being applied to one terminal thereof and the other terminal being at a fixed voltage and in the present case being connected to earth. The transformer 12 has two secondary windings 12b and 12c having a common terminal which is at a fixed voltage and which in the present case is also connected to earth. The other terminals of the secondary windings 12b and 12c are connected to the emitters of the transistors T₅ and T₆ respectively. The common terminal of the secondary windings 12b and 12c may alternatively be floating because no signal current flows through this terminal.

It is to be noted that if the radio-frequency signal is supplied by a floating source this source may be arranged directly between the emitters of the transistors T₅ and T₆.

The transistors T₅ and T₆ driven in this way constitute a balanced version of a common-base circuit. It has been found that this arrangement yields better linearity and consequently better intermodulation behaviour, whilst in addition a better signal-to-noise ratio can be achieved than by means of a differential amplifier, which is generally employed as a voltage-current converter in double-balanced mixer circuits. Furthermore, the dynamic range of the entire mixer circuit is increased because this range depends almost entirely on the dynamic range of the balanced common-base circuit. For optimum noise behaviour and/or optimum intermodulation behaviour the linearity of the circuit can be adjusted by means of the ratio between the input impedance of the common base circuit and the source impedance 11 of the input voltage source 10 transformed by the transformer 12. The magnitude of the input impedance of the common-base circuit can be controlled by varying the magnitude of the bias currents I from the current sources 8 and 9. The magnitude of the transformed source impedance 11 can be controlled by means of the transformation ratio of the transformer 12. In order to increase the linearity the transformed source impedance must be increased relative to the input impedance of the common base circuit.

The scope of the invention is not limited to the embodiment described. For example, instead of converting a signal source one side of which is earthed into a floating signal source by means of a transformer, this can be achieved in a different manner by means of a differential amplifier having a differential output. Moreover, it is possible to arrange two transistors in cascade with the transistors T₅ and T₆ in view of, for example, the suppression of radiated interference. Moreover, the mixer circuit is not limited to use in a radio receiver but may also be employed in, for example, television receivers and in automatic mobile telephony receivers. In the embodiment described the transistors are NPN transistors. It is obvious that, instead, PNP-transistors may be used. Alternatively, field-effect transistors may be used, in which case emitter, collector and base in the present Application should read: source, drain and gate respectively.

What is claimed is:

1. A double-balanced mixer circuit comprising a first differential pair of first and second transistors whose emitters are connected to a common first emitter terminal, a second differential pair of third and fourth transistors whose emitters are connected to a common second emitter terminal, the bases of the first and the fourth transistor and the bases of the second and the third transistor being coupled to a common first and a common second base terminal respectively, between which base terminals a mixing signal may be applied, and a voltage-current converter having an input for receiving an input signal and having first and second outputs which are coupled to the first and the second emitter terminal respectively, characterized in that the voltage-current converter comprises a balanced, common-base circuit comprising a fifth and a sixth transistor, whose bases are earthed for signal current, whose collectors are coupled to the first and the second emitter terminals respectively and whose emitters are coupled to a common power-supply terminal via respective current-supply elements, which emitters constitute the input of the voltage-current converter.

2. A double-balanced mixer circuit as claimed in claim 1, further comprising a transformer having a primary winding and first and second secondary windings, the primary winding having a pair of terminals to one of which the input signal may be applied and the other of which is at a fixed voltage, the first and second secondary windings each having a common terminal and another terminal, such other terminals of the secondary windings being respectively coupled to the emitters of the fifth and sixth transistors.

3. A double-balanced mixer circuit as claimed in claim 1, in which each of said transistors is a field-effect transistor having a source, drain and gate electrode which respectively serve as the emitter, collector and base of such transistors.

* * * * *